(12) United States Patent
Hanson et al.

(10) Patent No.: US 6,240,043 B1
(45) Date of Patent: May 29, 2001

(54) SDRAM WITH A MASKABLE INPUT

(75) Inventors: David R. Hanson, Brewster; Toshiaki Kirihata, Poughkeepsie; Gerhard Mueller, Wappinger Falls, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/456,588

(22) Filed: Dec. 8, 1999

(51) Int. Cl.⁷ ....................................................... G11C 8/00
(52) U.S. Cl. ....................................... 365/233; 365/230.08
(58) Field of Search ................................ 365/233, 230.08

(56) References Cited

U.S. PATENT DOCUMENTS 5,813,023 * 9/1998 Mclaury ............................... 365/233

* cited by examiner

Primary Examiner—David Nelms
Assistant Examiner—M. Tran
(74) Attorney, Agent, or Firm—Eric W. Petraske

(57) ABSTRACT

A random access memory (RAM) included in an integrated circuit and particularly a synchronous dynamic RAM (SDRAM) having a maskable data input. The SDRAM includes an xy data input register receiving a burst x bits long and y bits wide corresponding to the number of data lines (DQs). An xy mask register receives a corresponding mask bit for each received data bit, each mask bit indicating whether the corresponding data bit is stored in the SDRAM array. An enable buffer receives data outputs from the xy data input register and passes the individual data outputs to the array depending on corresponding mask states stored in the xy mask register. The mask register is preferably set to a masked state. Un masking occurs when an enable signal is asserted on a bit by bit basis. This allows the remaining bits within the burst length to be in a masked state when a write burst interrupt command is asserted. During an input prefetch, an interrupt may occur causing any received portion of the burst or prefetch to be stored in the array without disturbing memory locations corresponding to the balance or remaining bits of the prefetch.

17 Claims, 4 Drawing Sheets

| FIG.5A |
|---|
| FIG.5B |

SDRAM WITH A MASKABLE INPUT

RELATED APPLICATION

The present invention is related to U.S. patent application Ser. No. 09/456,589, entitled "A Prefetch Write Driver for a Random Access Memory" to Hanson et al., assigned to the assignee of the present application, filed coincident herewith and incorporated herein by reference.

BACKGROUND OF THE INVENTION

1. Field of the Invention

The present invention generally relates to semiconductor memories and, more particularly, to synchronous dynamic random access memory with data prefetch.

2. Background Description

Synchronous Dynamic Random Access Memory (SDRAM) chips are well known. Essentially, a state of the art SDRAM, is accessed by providing an initial memory location or address that identifies a first data access location in a string of serially accessed contiguous locations. The first address is known as the burst starting address and the data string is known as the burst or data burst. The burst may have a width, which may be 1 bit, 4 bits or 8 or more bits, and a length that may be 2, 4, 8 or more locations. Burst width and length are set at the SDRAM architecture designer's discretion and the result of numerous design trade offs. Internally to the SDRAM, during any particular access, all of the cells in the burst are accessed simultaneously in parallel and serialized for external burst transfers.

This serial external data transfer and parallel internal data transfer is also typically referred to as "data prefetch." Thus, data is passed to or retrieved from the chip serially, i.e., externally, and data passed to the chip may then be written to the array in parallel or read from the array in parallel to be passed off chip serially. Using data prefetch reduces the number of external data lines, which decreases chip area. Also, prefetch allows accessing the array at a significantly lower frequency than the external data rate, providing higher frequency operation.

In what are known as double data rate (DDR) SDRAMs input data is provided at both the rising and falling clock edge. So, for a two bit prefetch, one input (DQ) is provided to two internal data lines each operating at half of the input frequency. One of the two internal data lines receives data on the rising clock edge, the other receives data on the falling clock edge. For example an 8 bit prefetch, one input signal is provided to 8 receivers, allowing the receiver outputs signals to run with a frequency, which is 8 times smaller. Thus, DDR SDRAM prefetch allows the core memory circuits to operate at a significantly relaxed pace even though the data is supplied to the memory at much higher data bandwidth.

FIG. 1 shows a write driver circuit 100 for a prior art SDRAM. The write driver 100 is typically included in a sense amplifier for writing input data 102 to a memory array 103. A receiver 104 passes the input data when the receiver enable 106 is asserted. A latch 108 temporarily stores the data from the receiver 104. The latched data is passed to the input of write driver 110. When write enable 112 is asserted, write driver 110 passes the latched data to the memory array 103 for storage at a selected memory location. This approach is adequate when every data bit presented to the input is to be stored in the memory array 103.

As SDRAM performance objectives and operating frequency are pushed, increasingly, there is a need to prefetch 2 or more data bits. Increasing the number of prefetch bits produces an effective external operating frequency that is independent of the array operating frequency. Existing prefetch architectures merely replicate both the inputs and the write drivers for the number of pre-fetched bits. This approach increases the number of data busses and its associated bus area, which in turn results in a larger SDRAM chip.

Data masking is also difficult to implement in prefetch architecture SDRAMs. The individual prefetch bits must carry their mask information. It is impractical to provide the same mask for the whole prefetch package, since some of the bits may be masked whereas others are not.

Further the existing Joint Electron Device Engineering Council (JEDEC) SDRAM standard provides for a burst interrupt. For example, a four bit write operation can be interrupted after the first 2 bits have been written to initiate another four bit write operation. However, as yet, interrupt handling has not been done in a prefetch architecture with more than two bits. So, for an 8 bit prefetch architecture when an 8 bit burst is interrupted after 4 bits, the four bits must be stored in the array while information in cells corresponding to the data bits after the interrupt should not be disturbed. State of the art prefetch architectures do not provide for this.

Thus, there is a need for a Dynamic Random Access Memory (DRAM) and in particular for synchronous DRAMs that allow externally selecting which input bits of a bit string are stored in the array.

SUMMARY OF THE INVENTION

It is therefore a purpose of the present invention to enable burst interrupt during write operations in a pre-fetch architecture the Dynamic Random Access Memory (DRAM);

It is another purpose of the present invention to decrease DRAM chip area.

The present invention is an integrated circuit including a random access memory (RAM), especially, a synchronous dynamic RAM (SDRAM) having a maskable data input. The SDRAM includes an xy data input register receiving a burst x bits long and, y bits wide corresponding to the number of data lines (DQs). The xy mask register is set, initially, such that all bits will be in a masked state. An xy mask register receives a corresponding unmask bit for each received data bit, each unmask bit indicating whether the corresponding data bit is stored in the SDRAM array. An enable buffer receives data outputs from the xy data input register and passes the individual data outputs to the array depending on corresponding mask states stored in the xy mask register. During an input prefetch, an interrupt may occur causing any received portion of the burst or prefetch to be stored in the array without disturbing memory locations corresponding to the balance or remaining bits of the prefetch.

BRIEF DESCRIPTION OF THE DRAWINGS

The foregoing and other objects, aspects and advantages will be better understood from the following detailed preferred embodiment description with reference to the drawings, in which.

DETAILED DESCRIPTION OF A PREFERRED EMBODIMENT OF THE INVENTION

Figure 1:
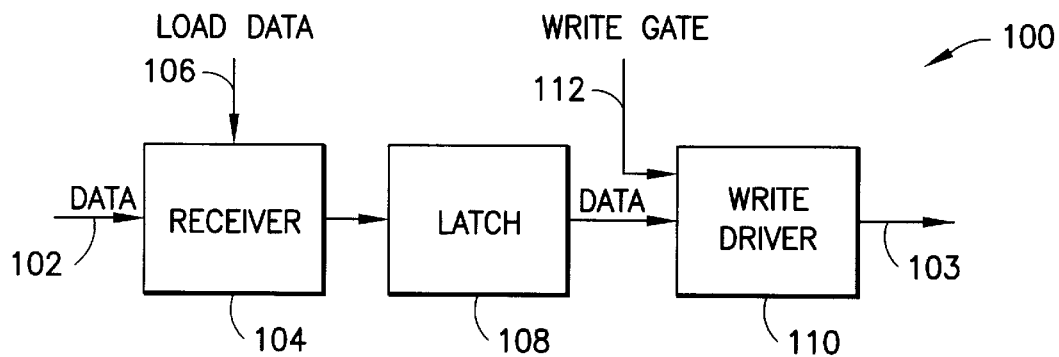
FIG. 1 is a typical prior art SDRAM input path.
Figure 2:
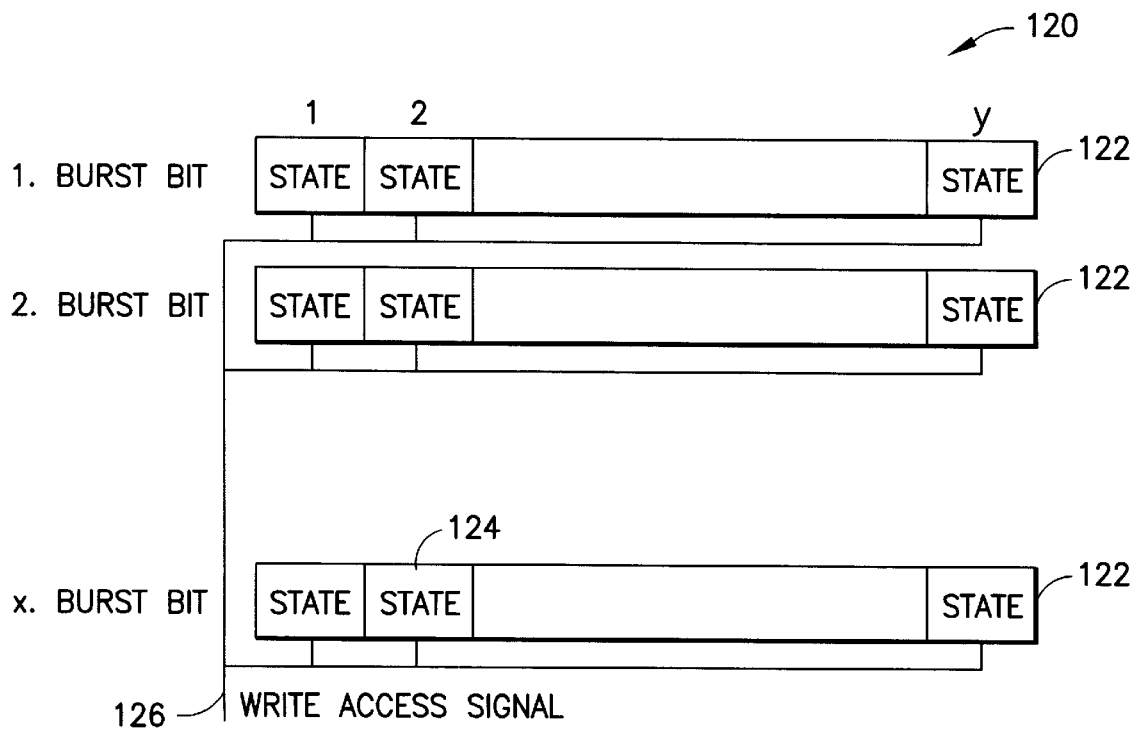
FIG. 2 shows schematically a mask register for maintaining mask states corresponding to prefetch input bits to a preferred embodiment synchronous dynamic random access memory (SDRAM)

Referring now to the drawings, and more particularly, FIG. 2 schematically shows a mask register 120 for maintaining mask states corresponding to prefetch input bits to an integrated circuit including a memory array. Preferably, the memory array is the array of a synchronous dynamic random access memory (SDRAM). In this embodiment, the burst length is x, e.g., 4 bits, and the memory has a data input/output (I/O) width of y DQs, e.g., by 8. If a burst write command is issued, xy bits (32 in this example) are provided simultaneously to the array. According to the preferred embodiment, the register 120 stores a mask state for each of the xy corresponding data bits in x registers 122, each register being y bits 124 wide.

The mask state for each bit determines whether burst data will be ignored or stored in the array upon a write. Initially, the state of each of the mask bit locations is cleared, disabling data transfer or masking data to prohibit a write operation. As each bit is serially provided to the SDRAM, a corresponding mask bit is set. When the write access signal 126 is asserted, data is transferred with corresponding mask states being set. After data is transferred to the array, the mask register is reset to the masked state, clearing the previously set mask bits to an unmasked state.

Figure 3:
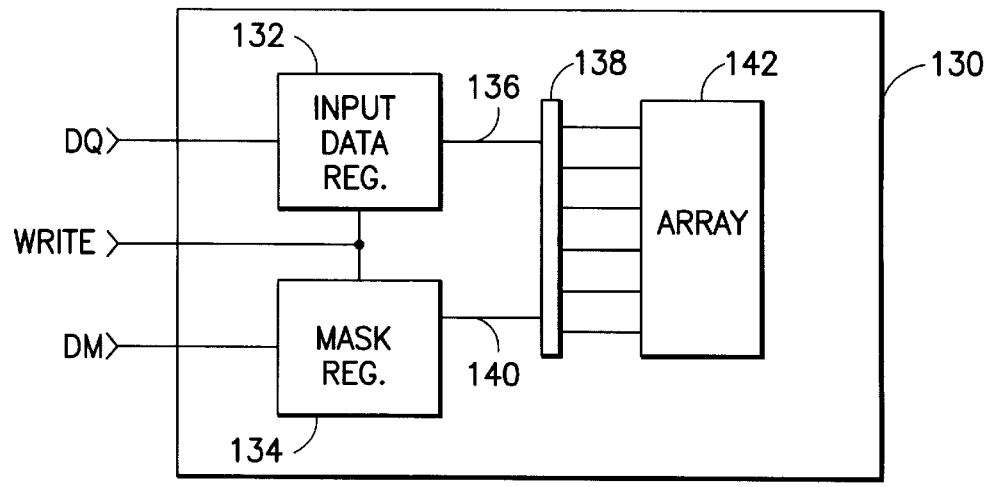
FIG. 3 is a SDRAM according to the present invention that may be interrupted at any point during a burst.

FIG. 3 shows a SDRAM 130 according to the present invention that may have its write operation interrupted at any point during a burst. The preferred SDRAM 130 includes an xy data input register 132 and an xy mask register 134 corresponding to mask register 120. Data outputs, represented collectively by line 136 from xy data input register 132, are passed to enable buffer 138. Corresponding mask state individual outputs, represented collectively by line 140 of mask register 134, cause the corresponding data bits to be passed or blocked at enable buffer 138. Data passed through the enable buffer 138 is written into the array 142. Array locations corresponding to data blocked by the enable buffer remains in its previous state.

Figure 4:
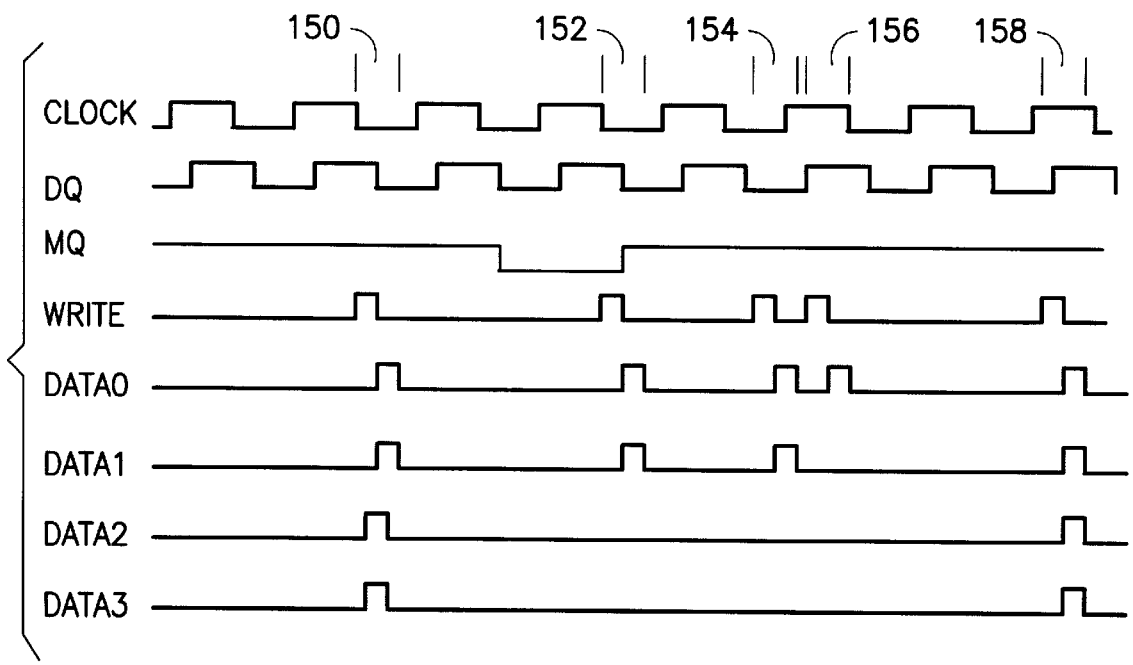
FIG. 4 is an example of a timing diagram for a single DQ of a SDRAM according to FIG. 3.

FIG. 4 is an example of a timing diagram for one DQ of a 4 bit prefetched DDR SDRAM 130. Data (DM) is provided on the rising and falling edge of a clock (CLOCK). For this example MQ is active low, i.e., DM="1" corresponds to not masking, or enabling, a particular write data operation; and DM="0" corresponds to masking, or disabling, data during a particular write operation. After providing four bits with the corresponding mask input (DM) remaining high, the write signal (WRITE) is asserted in the period labeled 150. The four stored bits on output 136, as represented by the pulses on lines DATA0, DATA1, DATA2 and DATA3, are passed through the enable buffer 138 to the array 142 because all four bits were unmasked in register 124. Next, the mask input (DM) drops after two bits are provided and, in the period labeled 152 data is provided only on the output of two enable buffers 138 because only the first 2 bits were unmasked in register 124. One clock cycle later in the period labeled 154, the write signal (WRITE) is asserted again and two bits are passed to the array 142 during an interrupt operation. When DM is high, the first and second bits are in an unmasked state when DM is low, the third and fourth bits are in a masked state. Only the first 2 bits are transferred during the write operation. Then, after two clock cycles in period 158, the write signal is asserted and data is passed to the array 142 on all four outputs 136.

Thus, as can be seen from FIG. 4, at the particular point during the transfer that an interrupt is received in period 154, the register location for each corresponding mask state for previously received data has been set with the remaining register locations remaining cleared. Data corresponding to set register locations are transferred by virtue of the write access signal being asserted, while the locations with cleared mask state locations remain unchanged.

Figures 5, 5A:
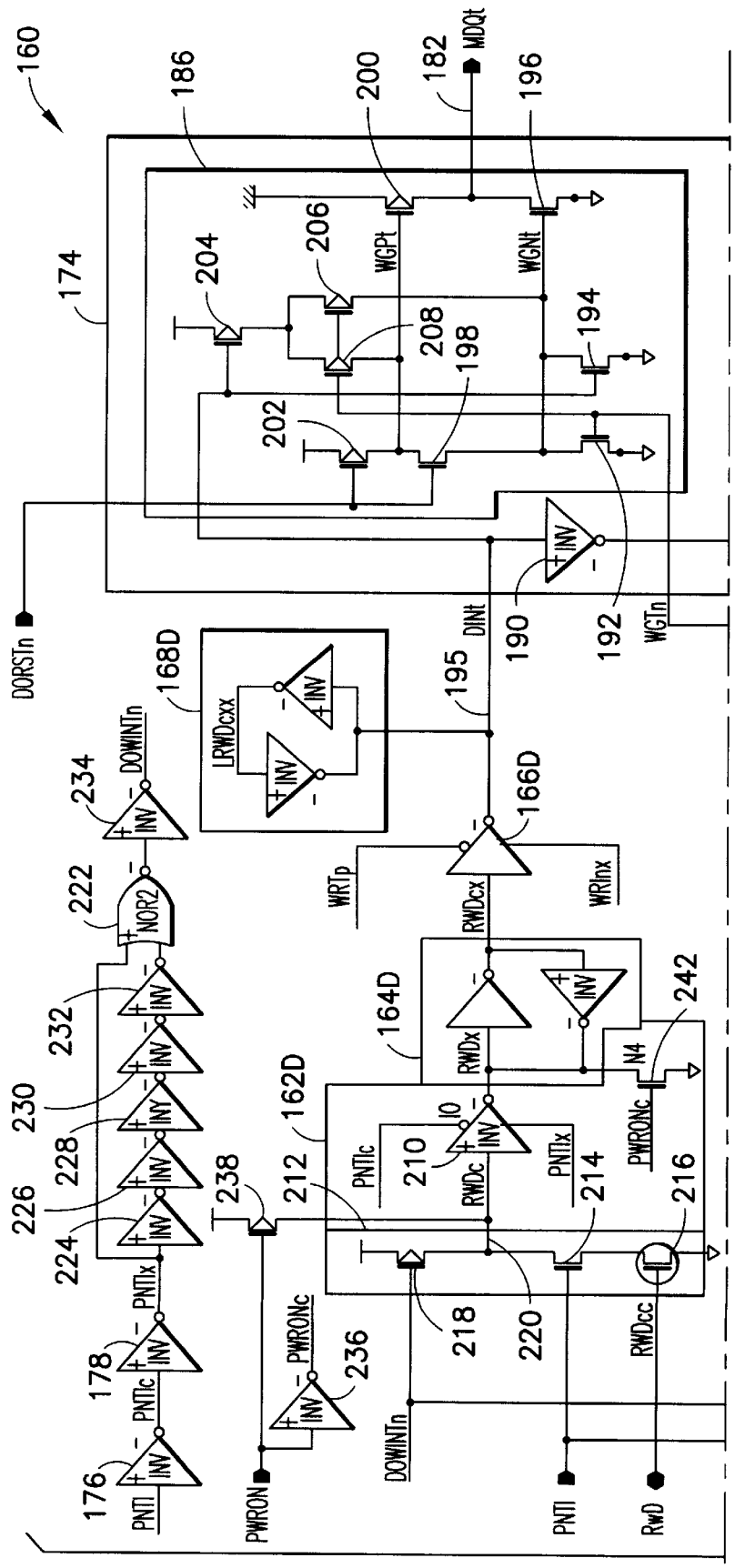
FIG. 5 is a a schematic of a data load and write driver circuit for implementing the preferred embodiment SDRAM chip.
Figure 5B:
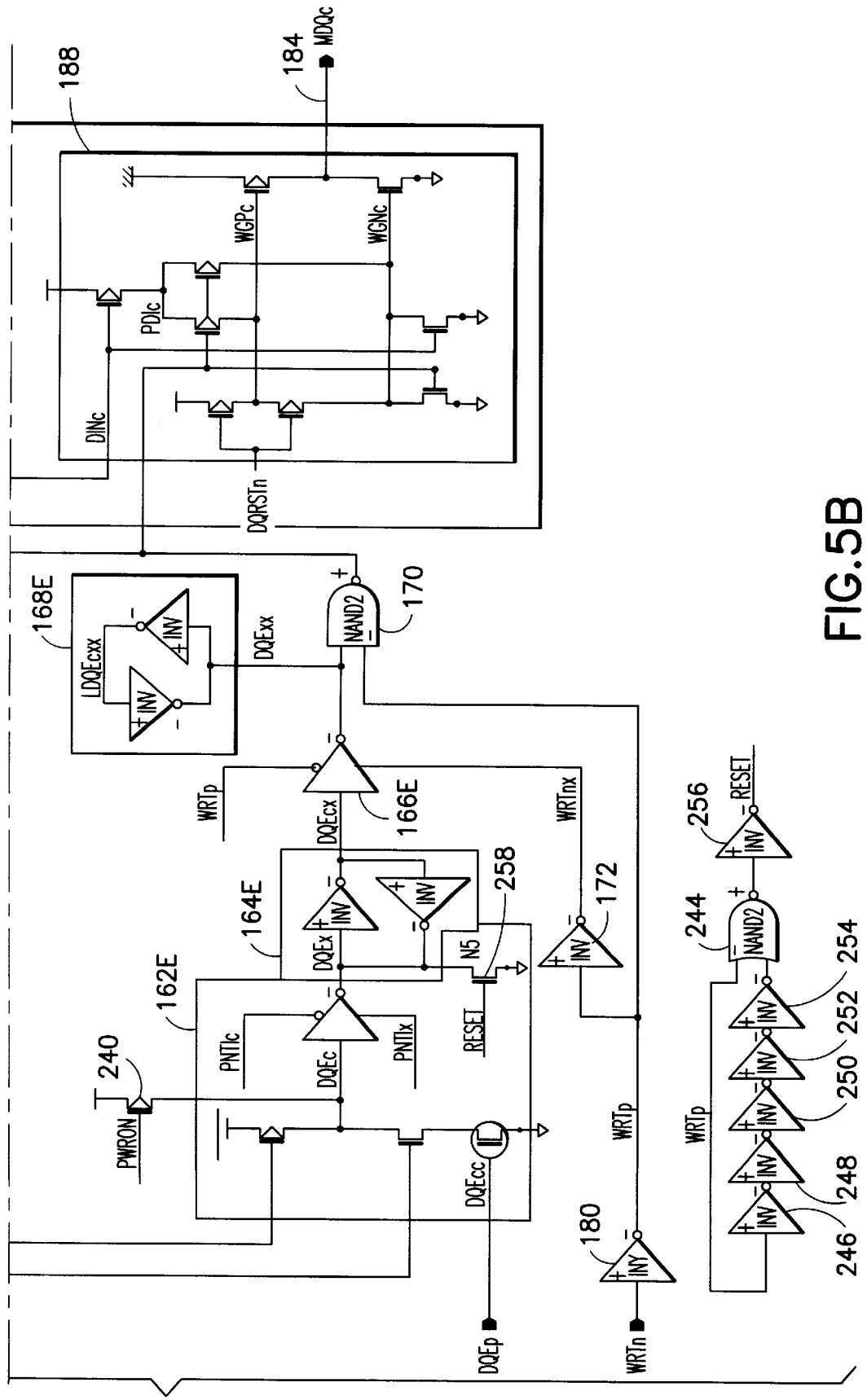

FIG. 5 is a schematic of a data load and write driver circuit 160 for implementing the preferred embodiment SDRAM chip 130. The data load and write driver circuit 160 of FIG. 5 is described in U.S. patent application Ser. No. 09/456,589 (Attorney Docket No. F19-99-217USI) entitled "A Prefetch Write Driver for a Random Access Memory" to Hanson et al., assigned to the assignee of the present application, filed coincident herewith and incorporated herein by reference. By including multiple data load and write driver circuits 160 on an SDRAM chip, the xy data input register 132 is the aggregation of the individual data paths which includes the input receivers 162D, first data latches 164D, drivers 166D and second data latches 168D. The xy mask register is the corresponding aggregation of the individual enable paths which includes the input receivers 162E, first enable latches 164E, drivers 166E and second enable latches 168E in combination with NAND gate 170 and inverter 172. The enable buffer 138 is the aggregation of the individual write drivers 174.

Latches 164D,F and 168D,E are each a pair of cross coupled inverters. In this embodiment, receivers 162D,E and drivers 166D,E each are enabled/disabled by complementary pairs of signals. These complementary pairs of signals are provided from a Load Data signal generated by inverters 176, 178 and from a Write Data signal generated by inverter 172 and inverter 180. Each write driver 174 provides a pair of complementary data outputs 182, 184. Each output phase 182, 184 is driven by a three state output driver 186, 188, respectively. Latched data from second data latch 168D is inverted by inverter 190 to provide a complementary pair, each being an input to one three state output driver 186, 188, respectively.

Each three state output driver 186, 188 includes a pair of parallel NFETs 192, 194 connected between ground and the gate of a driver NFET 196. The output of NAND gate 170 is connected to the gate of parallel NFET 192. The gate of the other parallel NFET 194 is driven directly by the data path output 195 or, by the output of inverter 190. A fourth NFET 198 is connected between the gate of a driver PFET 200 and the common connection of NFETs 192, 194 with the gate of driver NFET 196. A reset line DQRST is connected to the gate of NFET 198 and to the gate of PFET 202. PFET 202 is connected between a supply voltage source and the drain of NFET 198. The gate of a PFET 204 is driven by either the direct data path output or by the output of inverter 190. PFET 204 is connected between the supply voltage source and the common source connection of a pair of PFETS 206, 208. The gates of PFETs 206, 208 are both driven by the enable output of NAND 170. The drain of PFET 208 is connected to the common drain connection of NFET 198 and PFET 202 with gate of a driver PFET 200. The drain of the PFET 206 is connected to the common connection of the drains of NFETs 192, 194 with the source of NFET 198 and the gate of a driver NFET 196.

Input receivers 162D,E each include a three state driver 210 driven by a two input dynamic receiver 212. The two input dynamic receiver 212 includes two series connected NFETs 214, 216 and a clocked PFET 218 load. The series connected NFETs 214, 216 are connected between ground and output 220 and clocked PFET 218 load is connected between the supply voltage and the output 220. The gate of one NFET 214 is driven by the Load Data signal (PNTI) and the gate of the other NFET 216 is driven by a respective data input RWD or an enable input. The output 220 of dynamic receiver 214 is the input to the three state inverters 210.

The output of inverter 178 is also an input to a pulse generator that includes NOR gate 222 and 5 series connected inverters 224, 226, 228, 230 and 232. The pulse generator output is inverted by inverter 234 to provide the clock (DQWINT$_n$) gating load PFET 218 in two input dynamic receiver 212. A power on signal (PWRON) is connected to the input to inverter 236 and is connected to the gate of PFETs 238, 240, which are each connected between the supply voltage and the output 220 of a respective dynamic receiver 212. The output of inverter 236 drives the gate of NFET 242 in receiver 162D, which is connected between ground and the input to latch 164D.

The output of inverter 180 is also the input to a second pulse generator that includes NAND gate 244 and the input to 5 series connected inverters 246, 248, 250, 252 and 254. The pulse generator output is inverted by inverter 256. The output of inverter 256 drives the gate of NFET 258, which is connected between ground and the input side of latch 164E.

Initially, at power on, PWRON is low turning on PFETS 238 and 240 to force high the respective input (RWD$_c$ and DQE$_c$) to three state inverter 210. In both paths the three state inverter 210 is in a high impedance state because the PNTI signal is low. Inverter 236, inverting PWRON, places a high on the gate of transistor 242, which forces RWD$_x$ low on the input side of latch 164D at the output of receiver 162D. The low on RWD$_x$ sets the latch and RWD$_{cx}$ is high. Write Data signal (WRT$_n$) is low. Both three state inverters 210, 212 are in their high impedance state because PNTI is low. The high on WRT$_n$ enables both three state drivers 166D, E, which pass the high on RWD$_{cc}$ and DQE$_{cx}$ to latches 168D,E, respectively, and the data output of driver 168D is also passed to Write Driver 174.

However, the enable is blocked by NAND gate 170 because WRT$_n$ is inverted by inverter 180 and so, provides a low input to NAND gate 170, preventing NAND gate 170 from passing the enable. The low input to NAND gate 170 from inverter 180 holds the output of the NAND gate 170 high, disabling three state output drivers 186, 188. The high from NAND gate 170, turns off both PFETs 206, 208 and turns on NFET 192. The driver 174 is initialized by driving DQRST$_n$ high which turns on NFET 198 and turns off PFET 202. Turning on NFET 190 drives the gate of driver PFET 200 low, to turn it on. NFET 192 holds the gate of driver NFET 196 low and, therefore, off. PFETs 206, 208 being off isolates the gates of respective driver FET 200, 196 from PFET 204, which is driven by the output of inverter 190 or the output of the data path. Thus, with both driver NFET 196 and driver PFET 200 on, the driver 174 is in its precharge state.

After an initial power up period, PWRON rises turning off PFETS 238 and 240, the output of inverter 236 falls turning off NFET 242. During normal operation a data bit and a corresponding enable state bit are provided to inputs RWD and DQE$_p$, respectively. Note that regardless of the state of the DQE$_p$ signal, DQE$_c$ is in a high state corresponding to a masked state until PNTI is asserted high. These inputs are NAND'ed in dynamic receiver 212 with the Load Data signal, PNTI. When PNTI is driven high, both three state drivers 210 are enabled and, the clock (DQWINT$_n$) gating clocked load PFETs 218 remains high. The shared data line input is loaded and inverted by dynamic receiver 212 and passed to a respective three state drivers 210 which re-inverts and passes the data or enable bit to latch 164 D,E. Since the Write Data signal (WRT$_n$) is high, drivers 166D,E pass the contents of latches 164D,E to second latches 168D,E.

When PNTI is driven low, three state driver 210 are forced into their high impedance state and the PNTI input to dynamic receiver 212 opens the path to ground. Coincidentally, DQWINT$_n$ is driven low for a period equal to the propagation delay of five inverters 224, 226, 228, 230 and 232. DQWINT$_n$ being low turns on PFETs 218 to precharge the output 220 high.

When the Write Data signal WRT$_n$ is driven low, drivers 166D,E are disabled and RESET is driven high for a period equal to the propagation delay of five inverters 246 248, 250, 252 and 254. RESET being driven high turns on NFET 258 to reset the first latch 164E in enable path. If the enable bit stored in enable path first latch 164E is high, both inputs to NAND gate 170 are high causing the NAND gate 170 to drive its output low, enabling Write Driver 174. In both three state output drivers 186, 188 both PFETs 206, 208 are turned on and NFET 192 is turned off. Thus, with the output of NAND gate 170 low, the complementary outputs 182, 184 reflect the state of data path second latch 168D. When the Write Data signal WRT$_n$ returns high, drivers 166D,E are enabled and the contents of first latches 164D,E are passed to second latches 168D,E including the low from reset latch 164E.

Thus, an SDRAM chip including 4 by y data load and write driver circuits 160 with appropriate burst bit selection logic results in an SDRAM chip of the example of FIG. 4. So, for example a preferred embodiment 8 by 8 SDRAM could be formed by including 64 data load and write driver circuits 160. In such an 8 by 8 embodiment, the first 4 by 8 locations may be ignored and the last 4 by 8 locations can be loaded by setting the mask low (disabled) during the first two clock cycles and raising the mask (enabling) during the second two. Further, the burst transfer can be interrupted and the data from the partial burst may be loaded without disturbing the rest of the array.

While the invention has been described in terms of preferred embodiments, those skilled in the art will recognize that the invention can be practiced with modification within the spirit and scope of the appended claims.

We claim:

1. An integrated circuit comprising:
    an array of memory cells;
    an xy data input register;
    an xy mask register; and
    an enable buffer, data outputs from the xy data register being passed to the enable buffer, individual data outputs being passed to the array responsive to corresponding mask state outputs;
    wherein said array is a memory array of a random access memory (RAM), x is a bit burst length, and y is a bit burst width.

2. A RAM as in claim 1, wherein a plurality of xy mask register locations may be such that a one or more corresponding mask state outputs prevent passing of one or more corresponding data bits to selected memory locations, contents of said selected memory locations remaining unchanged.

3. A RAM as in claim 2 further comprising:

a write input, data bits in said xy data input register having corresponding mask bits set in said xy mask register being passed to said array further responsive to a write signal on said write input.

4. A RAM as in claim 3, wherein said xy data register includes a plurality of multibit locations, each of said multibit locations comprising:

a receiver selectively passing a data from a data input line;

a first latch latching data passed from said receiver;

a driver selectively driving the contents of said first latch; and a second latch latching the output of said driver.

5. A RAM as in claim 4, wherein inputs to corresponding bits of each of said multibit locations are connected together, receivers of said corresponding bits receiving a data stream and selectively passing selected bits from said received data stream.

6. A RAM as in claim 5, wherein said xy mask register includes a plurality of corresponding multibit locations, each of said corresponding multibit locations comprising:

a receiver selectively passing a mask from a mask input line;

a first latch latching a mask passed from said receiver;

a driver selectively driving the contents of said latch; and a second latch latching the output of said driver.

7. A RAM as in claim 6, wherein inputs to corresponding masks of each of said multibit locations are connected together, receivers of said corresponding masks receiving a mask input and selectively passing said mask input.

8. A RAM as in claim 7, wherein in each of the xy data register and the xy mask register, the first latch and the second latch each comprise a pair of cross coupled inverters.

9. A RAM as in claim 8, wherein in each of the xy data register and the xy mask register, the receiver and the driver each comprises a three state driver.

10. A RAM as in claim 9, wherein the output buffer comprises a plurality of write drivers, a data bit from said xy data register being provided to said write driver, and a corresponding mask from said xy mask register selectively enabling said write driver.

11. A RAM as in claim 9 wherein after data is passed to said memory array, the mask bits in the xy mask register are all reset to prevent passing data.

12. A RAM as in claim 1, wherein the RAM is a synchronous dynamic RAM (SDRAM) and wherein a stream of data is presented to the SDRAM at a data input to said xy data input register and a mask is presented to the xy mask register, said mask being negated whenever said data input is interrupted, data being received prior to interrupting said data input being passed to said array.

13. A synchronous dynamic random access memory (SDRAM) comprising:

an array of memory cells;

an xy data input register receiving and storing a stream of data from a data input;

an xy mask register receiving and storing a corresponding mask state for each received bit of data and providing a corresponding mask output responsive to a write signal; and an enable buffer receiving data outputs from the xy data input register, individual data outputs being passed to the array responsive to said corresponding mask outputs, wherein a plurality of xy mask register locations may be in a state such that corresponding mask outputs prevent passing of corresponding data bits to selected memory locations, contents of said selected memory locations remaining unchanged.

14. A SDRAM as in claim 13, wherein the xy data register and the xy mask register each includes a plurality of multibit locations, each of said multibit locations comprising:

a receiver selectively passing an input;

a first latch latching said passed input from said receiver;

a driver selectively driving the contents of said first latch; and a second latch latching the output of said driver.

15. A SDRAM as in claim 14, wherein each of the first latch and the second latch comprise a pair of cross coupled inverters.

16. A SDRAM as in claim 15, wherein the receiver and the driver each comprises a three state driver.

17. A SDRAM as in claim 16 wherein after data is passed to said array, the mask bits in the xy mask register are all reset to prevent passing data.

* * * * *